United States Patent [19]

Sugimoto et al.

[11] Patent Number: 5,197,016
[45] Date of Patent: Mar. 23, 1993

[54] INTEGRATED SILICON-SOFTWARE COMPILER

[75] Inventors: Tai Sugimoto; Hideaki Kobayashi, both of Columbia, S.C.; Masahiro Shindo; Haruo Nakayama, both of Osaka, Japan

[73] Assignees: International Chip Corporation, Columbia, S.C.; Ricoh Company, Ltd., Tokyo, Japan

[21] Appl. No.: 380,079

[22] Filed: Jul. 14, 1989

Related U.S. Application Data

[63] Continuation-in-part of Ser. No. 143,821, Jan. 13, 1988, Pat. No. 4,922,432.

[51] Int. Cl.⁵ .................................................. G06F 15/60
[52] U.S. Cl. .................................... 364/490; 364/489; 364/488
[58] Field of Search ................ 364/488, 489, 490, 491

[56] References Cited

U.S. PATENT DOCUMENTS

| | | | |
|---|---|---|---|
| 4,648,044 | 3/1987 | Hardy et al. | 395/76 |
| 4,658,370 | 4/1987 | Erman et al. | 395/76 |
| 4,675,829 | 6/1987 | Clemenson | 395/65 |
| 4,703,435 | 10/1987 | Darringer et al. | 364/489 |
| 4,922,432 | 5/1990 | Kobayashi et al. | 364/490 |

OTHER PUBLICATIONS

"A Front End Graphic Interface to the First Silicon Compiler" by J. H. Nash et al., European Conf. on Electronic Design Automation (EDA84), pp. 120–124.
*An Engineering Approach to Digital Design*, William I. Fletcher, Prentice-Hall, Inc. pp. 491-505.

*Primary Examiner*—Vincent N. Trans
*Attorney, Agent, or Firm*—Bell, Seltzer, Park & Gibson

[57] ABSTRACT

A computer-aided system and method is disclosed for designing an application specific integrated circuit (ASIC) whose intended function is implemented both by a hardware subsystem including hardware elements on the integrated circuit and by a software subsystem including a general purpose microprocessor also on the integrated circuit. The system also generates software instructions for use by the software subsystem. The system utilizes a knowledge based expert system, with a knowledge base extracted from expert ASIC designers, and thus makes it possible for ASIC's to be designed and provided quickly and economically by persons not having the highly specialized skill of an ASIC designer.

32 Claims, 7 Drawing Sheets

INTEGRATED SILICON-SOFTWARE COMPILER

CROSS-REFERENCE TO RELATED APPLICATION

This application is a continuation-in-part of copending U.S. application Ser. No. 143,821, filed Jan. 13, 1988, now U.S. Pat. No. 4,922,432.

FIELD AND BACKGROUND OF THE INVENTION

This invention relates to the design of integrated circuits, and more particularly relates to a computer-aided system and method for designing application specific integrated circuits.

An application specific integrated circuit (ASIC) is an integrated circuit chip designed to perform a specific function, as distinguished from standard, general purpose integrated circuit chips, such as microprocessors, memory chips, etc. A highly skilled design engineer having specialized knowledge in VLSI circuit design is ordinarily required to design an ASIC. In the design process, the VLSI design engineer will consider the particular objectives to be accomplished and tasks to be performed by the integrated circuit and will create structural level design specifications which define the various hardware components required to perform the desired function, as well as the interconnection requirements between these components. A system controller must also be designed for synchronizing the operations of these components. This requires an extensive and all encompassing knowledge of the various hardware components required to achieve the desired objectives, as well as their interconnection requirements, signal level compatibility, timing compatibility, physical layout, etc. At each design step, the designer must do tedious analysis. The design specifications created by the VLSI design engineer may, for example, be in the form of circuit schematics, parameters or specialized hardware description languages (HDLs).

From the structural level design specifications, the description of the hardware components and interconnections is converted to a physical chip layout level description which describes the actual topological characteristics of the integrated circuit chip. This physical chip layout level description provides the mask data needed for fabricating the chip.

Due to the tremendous advances in very large scale integration (VLSI) technology, highly complex circuit systems are being built on a single chip. With their complexity and the demand to design custom chips at a faster rate, in large quantities, and for an ever increasing number of specific applications, computer-aided design (CAD) techniques need to be used. CAD techniques have been used with success in design and verification of integrated circuits, at both the structural level and at the physical layout level. For example, CAD systems have been developed for assisting in converting VLSI structural level descriptions of integrated circuits into the physical layout level topological mask data required for actually producing the chip. Although the presently available computer-aided design systems greatly facilitate the design process, the current practice still requires highly skilled VLSI design engineers to create the necessary structural level hardware descriptions.

Only a small number of VLSI designers possess the highly specialized skills needed to create structural level integrated circuit hardware descriptions. Even with the assistance of available VLSI CAD tools, the design process is time consuming and the probability of error is also high because of human involvements. There is a very significant need for a better and more cost effective way to design custom integrated circuits.

In U.S. application Ser. No. 143,821, filed Jan. 13, 1988, and entitled *Knowledge Based Method and Apparatus for Designing Integrated Circuits Using Functional Specifications*, there is disclosed a computer-aided design system and method which enables a user to define the functional requirements for a desired application specific integrated circuit using an easily understood architecture independent functional level representation, such as a flowchart. From this functional level description, a computer implemented expert system generates the detailed structural level definitions needed for producing the application specific integrated circuit. The structural level definitions include a list of the integrated circuit hardware cells needed to achieve the functional specifications. Also included in the detailed structural definitions are the data paths among the selected hardware cells, a system controller for coordinating the operation of the cells and control paths for the selected integrated circuit cells. The various hardware cells are selected from a cell library of previously designed hardware cells of various functions and technical specifications. From this detailed structural level definition it is possible, using either known manual techniques or existing VLSI CAD layout systems to generate the detailed chip level geometrical information (e.g. mask data) required to produce the particular application specific integrated circuit in chip form.

The system described in the aforementioned copending application provides a very significant advance over the methods previously available for designing application specific integrated circuits and opens the possibility for the design and production of application specific integrated circuits by designers, engineers and technicians who may not possess the specialized expert knowledge of a highly skilled VLSI design engineer.

SUMMARY OF THE INVENTION

The present invention provides an improvement over and an extension to the system and method of the aforementioned copending application. Although the system and method of the aforementioned application provides an excellent means for designing ASICs whose functions are implemented in hardware form, there are some occasions where particular functions of the ASCI would best be implemented by software.

The present invention provides a computer-aided system and method for designing an application specific integrated circuit whose intended function is implemented by both a hardware subsystem including hardware elements on the integrated circuit and by a software subsystem including a general purpose microprocessor. Thus, the resulting ASIC produced by the computer-aided design system and method of the present invention includes, on a single integrated circuit chip, a microprocessor for executing the software instructions of the software subsystem and various integrated circuit hardware cells for performing other functions of the integrated circuit.

The system more particularly utilizes a knowledge based expert system, with a knowledge base extracted from expert ASIC designers with a high level of expertise in system design. The knowledge base contains rules for selecting software subroutines from a software subroutine library of predefined functions or operations, as well as rules for selecting hardware cells from a cell library of predefined cells of various types and functions. An inference engine is provided for selecting appropriate hardware cells or software subroutines from these libraries in accordance with the rules of the knowledge base.

The functional specifications of the desired ASIC are independent of any particular architecture or design style and can be defined in a suitable manner, such as in text form or preferably in a flowchart format. The flowchart is a highly effective means of describing a sequence of logical operations, and is well understood by software and hardware designers of varying levels of expertise and training. The designer, when defining the series of operations which implement the intended function of the application specific integrated circuit, may specify whether a particular operation should be implemented in hardware or in software.

The designer may also specify design constraints for the ASIC, such as annual volume, speed, size, pin count, packaging type, power consumption and thermal stability. The knowledge base contains design style rules for selecting, based upon the specified design constraints, an optimum design style for implementation of the hardware subsystem employing various technologies such as programmable logic device (PLD), gate array, standard cell and macro cell.

BRIEF DESCRIPTION OF THE DRAWINGS

The invention will be better understood by reference to the detailed description which follows, taken in connection with the accompanying drawings, in which.

MORE DETAILED DESCRIPTION OF THE INVENTION

System Overview

Figure 1:
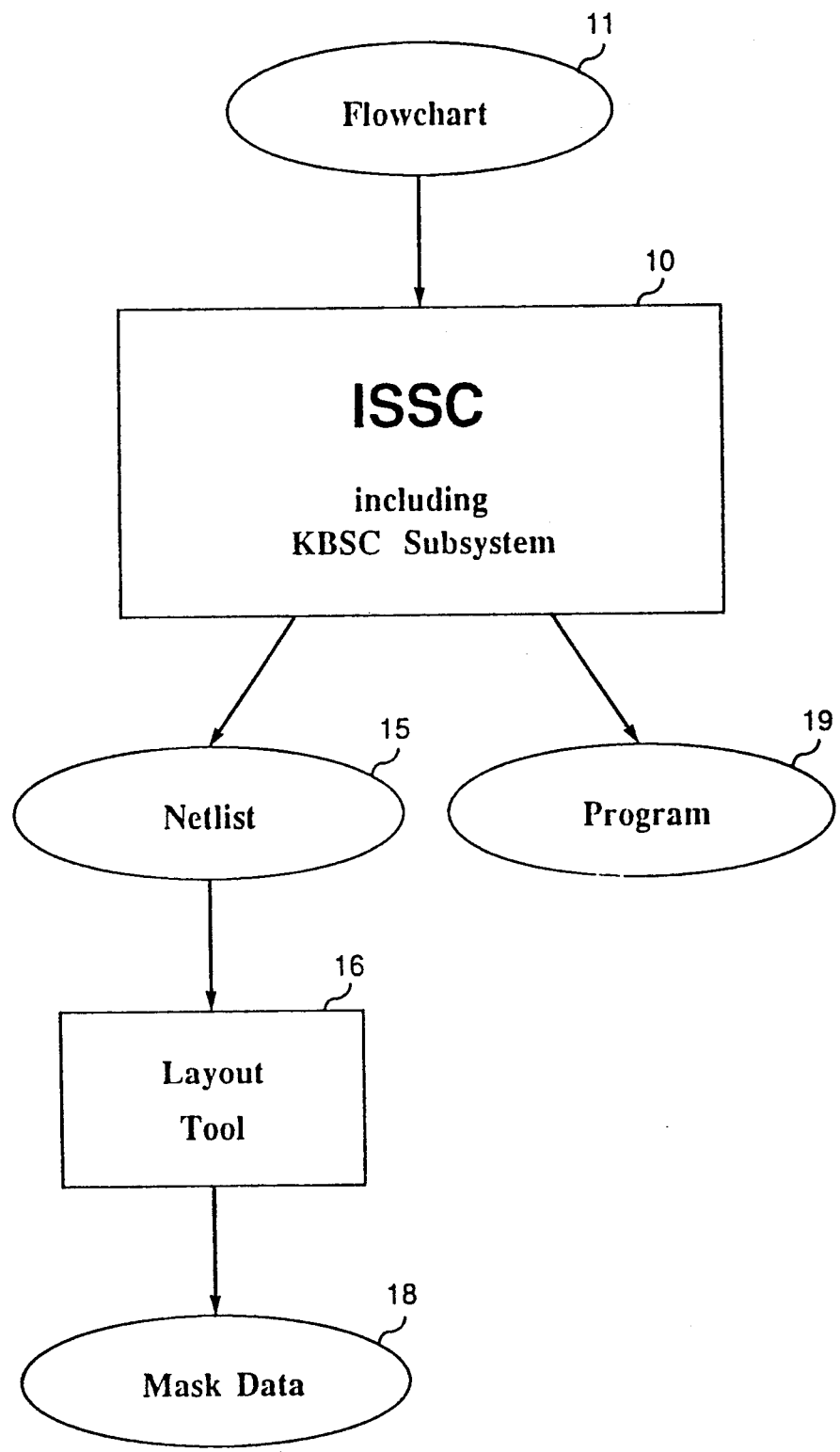
FIG. 1 is a block schematic diagram showing how integrated circuit mask data is created from flowchart descriptions by the system of the present invention.

The overall system flow in accordance with the present invention is illustrated in FIG. 1. The computer-aided system and method of the present invention is represented by the block 10, and for simplicity is referred to herein by the acronym ISSC (integrated silicon-software compiler). The ISSC 10 receives as its input (which are technology and architecture independent) specifications 11, and which define on a functional or behavioral level the functions which are to be performed by the target application specific integrated circuit (ASIC). As illustrated in FIG. 1, the user enters the functional specifications of the desired target ASIC into the integrated silicon-software compiler (ISSC) 10 in the form of a flowchart 11. The ISSC 10 then generates a netlist 15 from the flowchart. The netlist 15 includes architecture specific definitions of the hardware cells required to implement the functions of the hardware subsystem, a definition of the microprocessor used to implement the functions of the software subsystem, and definitions of a system controller, data paths and control paths for interconnecting the various components. The netlist 15 can be used as input to any existing VLSI layout and routing tool 16 to create mask data 18 for geometrical layout. The ISSC system 10 also generates a program 19 from the flowchart information for implementing the functions of the software subsystem. The program 19 can be stored in an external or internal memory associated with the microprocessor on the target ASIC.

The ISSC system 10 can be operated on a suitable programmed general purpose digital computer. By way of example, one embodiment of the system is operated in a workstation environment such as Sun3 and VAX-Station-II/GPX running UNIX Operating System and X Window Manager. The software uses C programming language and a data base such as INGRES or Gbase. The human interface is mainly done by the use of a pointing device, such as a mouse, with pop up menus, buttons, and a special purpose command language. The permanent data of the integrated circuit design are stored in a database for easy retrieval and update. Main memory temporarily stores the executable code, design data (flowchart, logic, etc.), data base (cell library), and knowledge base. The CPU performs the main tasks of creating and simulating flowcharts and the automatic synthesis of the design.

Figure 2:
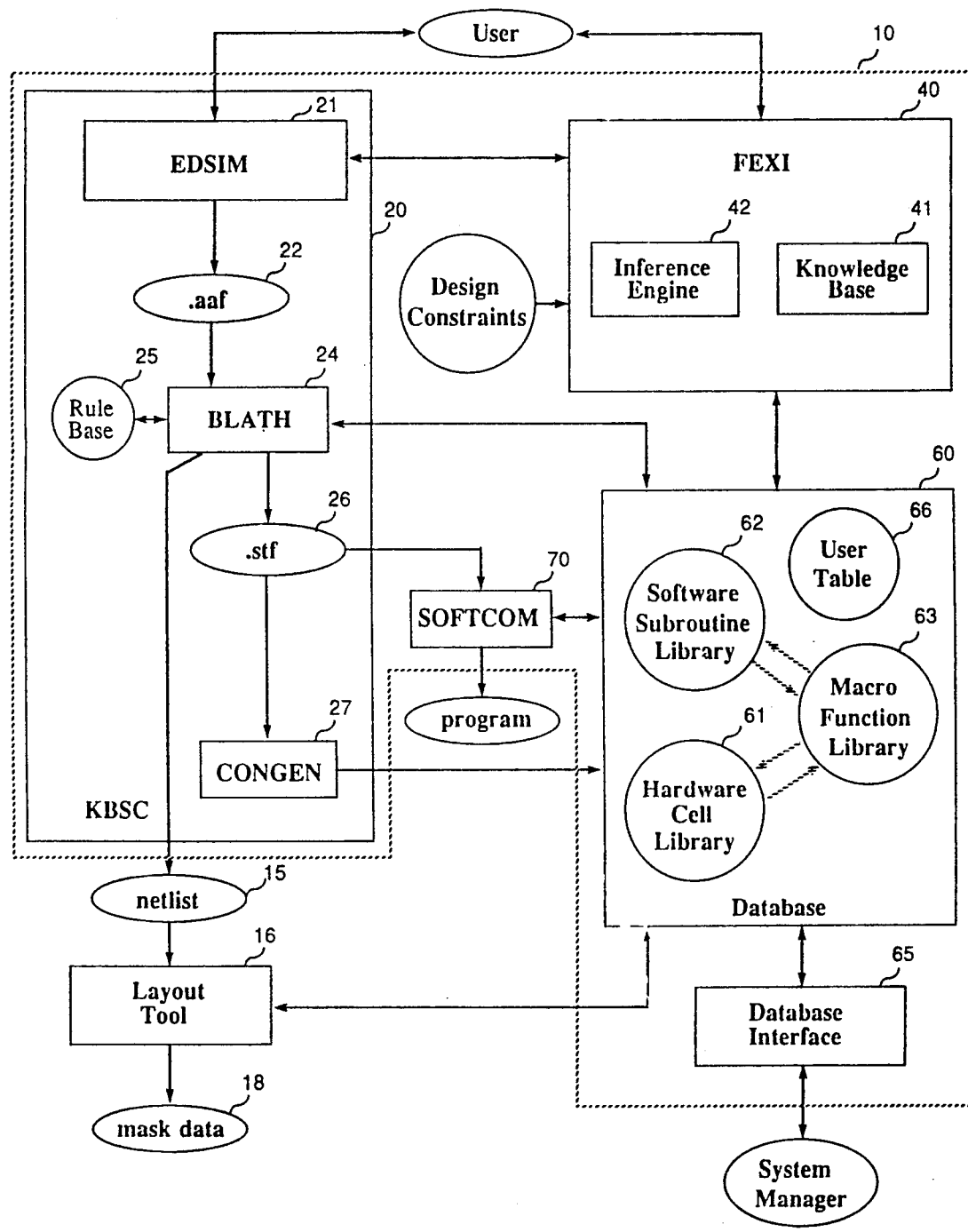
FIG. 2 is a block schematic diagram showing the various elements of the integrated silicon-software compiler system and method of the present invention.

The primary elements or modules which comprise the ISSC system are shown in FIG. 2. In the embodiment illustrated and described herein, these elements or modules are in the form of software programs, although persons skilled in the appropriate art will recognize that these elements can be easily embodied in other forms, such as in hardware for example.

Referring more particularly to FIG. 2, it will be seen that the ISSC system 10 includes a module or subsystem 20 called KBSC (Knowledge Based Silicon Compiler). The KBSC subsystem 20 corresponds to the system and method described in copending U.S. application Ser. No. 143,821, filed Jan. 13, 1988, the subject matter of which is incorporated herein by reference. As shown in FIG. 2, the KBSC subsystem 20 includes a number of modules or programs which collectively provide an interface with the user for receiving input of the functional specifications for the particular target ASIC and which provide as output a netlist 15 and a program 19. Other major subsystems or modules of the ISSC 10 include a front-end expert system interface (FEXI) 40, a database 60 and a software compiler (SOFTCOM) 70.

The KBSC subsystem 20 includes a program 21 called EDSIM (EDitor SIMulator), which comprises a flowchart editor for creating and editing flowcharts and a flowchart simulator for simulation and verification of flowcharts. The output of EDSIM 21 is an intermediate file 22, referred to as an Antecedent-Action-Form (AAF), which contains a behavioral description of the system that is to be designed. The AAF file 22 contains information about storage elements which compose the data paths, memory elements and external connections to the system. The AAF file 22 is the input to the BLATH program 24.

The BLATH (Block Level Aaf To Hardware) program 24 is a knowledge based logic synthesis program which selects optimum hardware cells for the hardware subsystem from the hardware cell library and also selects a microprocessor or CPU megacell for use by the software subsystem. The selection is based upon functional descriptions in the flowchart, as specified by the macros assigned to each action represented in the flowchart. BLATH 24 uses a knowledge base 25 extracted from VLSI design experts to select the hardware cells and microprocessor based upon design constraint rules, design style selection rules, and software/hardware routine selection rules. BLATH 24 selects from a database 60 which includes a hardware cell library 61 of previously designed hardware cells and a software subroutine library 62 of previously designed software subroutines. BLATH 24 also outputs an STF file 26 which is used by a system controller generator CONGEN (CONtroller GENerator) 27 and by the software compiler (SOFTCOM) 70. The controller generator 27 generates a custom designed system controller for controlling the operation of the hardware cells and coordinating with the microprocessor of the software subsystem. Thus, with a functional flowchart input from EDSIM 21, BLATH 24 selects a microprocessor and all required hardware cells, generates data and control paths, and generates a netlist 15 describing all of ASIC design information.

Target ASIC Design

Figure 3:
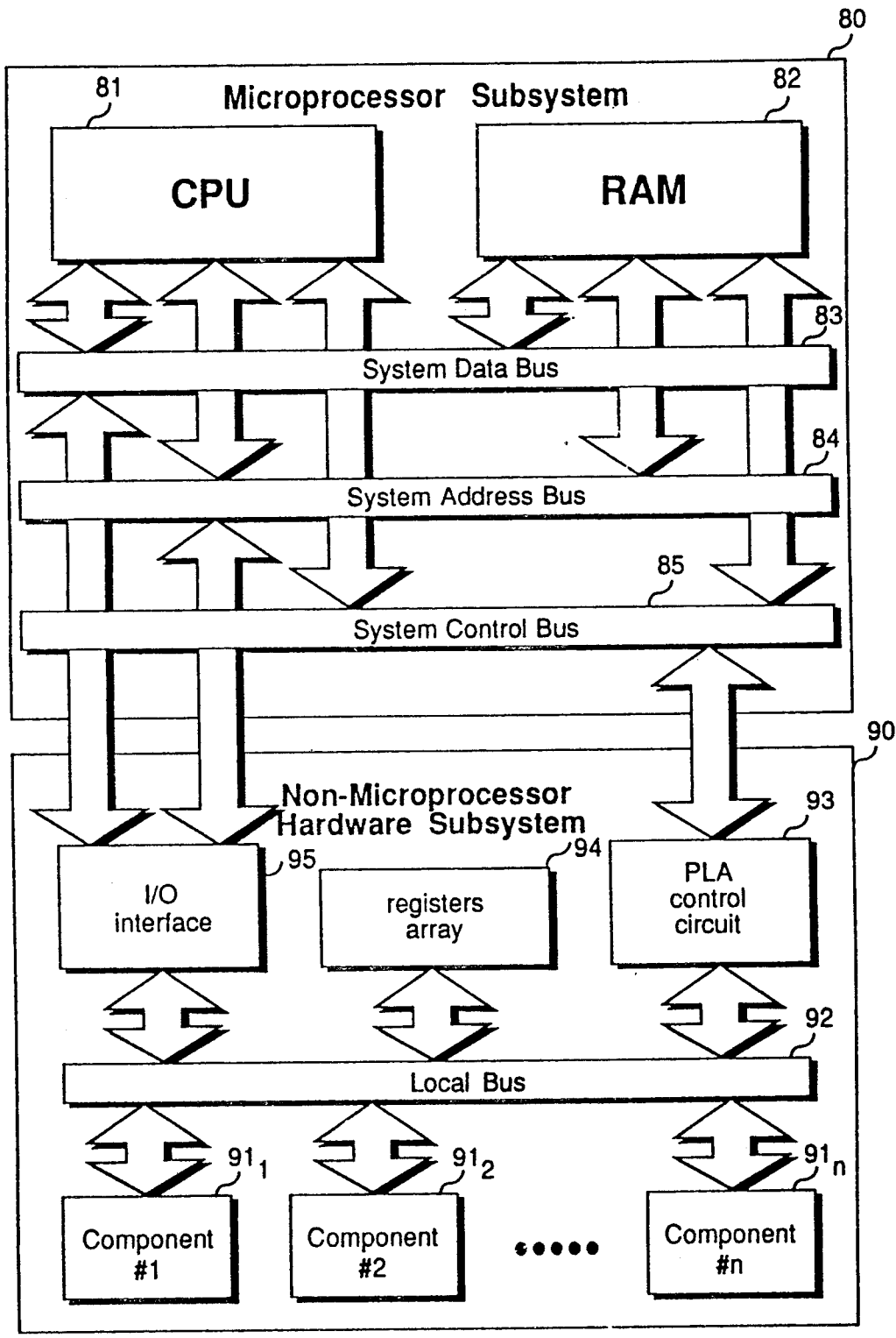
FIG. 3 is a schematic illustration of the system configuration of an ASIC containing both a microprocessor subsystem and a non-microprocessor hardware subsystem.

FIG. 3 illustrates the system configuration of an application specific integrated circuit (ASIC) designed using the ISSC 10. It consists of two subsystems, a microprocessor subsystem 80 and a non-microprocessor hardware subsystem 90. The microprocessor subsystem contains a general purpose microprocessor CPU 81 and random access memory (RAM) 82 to execute the software functions of the ASIC. The software program is stored in RAM memory 82. The hardware subsystem 90 contains special purpose hardware components or cells which perform the functions of the ASIC. Functions are executed in special hardware components primarily to reduce processing time. The various hardware components $91_1$, $91_2$ ... $91_n$ are integrated into a subsystem which includes a local bus 92, a PLA control circuit 93, a register array 94 and an input/output interface 95. These two subsystems communicate with each other through a system data bus 83, a system address bus 84 and a system control bus 85.

EDSIM

The creation and verification of the flowchart is the first step in the VLSI design methodology. The translation from an algorithm to an equivalent flowchart is performed with the flowchart editor, which is contained within the program EDSIM 21. The flowchart editor provides a working environment for interactive flowchart editing with a designer friendly interface. A graphical display of the flowchart is provided consisting of boxes, diamonds, and lines. All are drawn on the screen and look like a traditional flowchart. The flowchart editor also provides functions such as loading and saving flowcharts. EDSIM will generate an intermediate file 22 for each flowchart. This file is then used by the BLATH program 24 to generate a netlist 15.

The main editing functions of the flowchart editor include, create, edit, and delete states, conditions, and transitions. The create operation allows the designer to add a new state, condition, or transition to a flowchart. Edit allows the designer to change the position of a state, condition or transition, and delete allows the designer to remove a state, condition or transition from the current flowchart. States which contain actions are represented by boxes, conditions are represented by diamonds, and transitions are represented by lines with arrows showing the direction of the transition.

Figure 4:
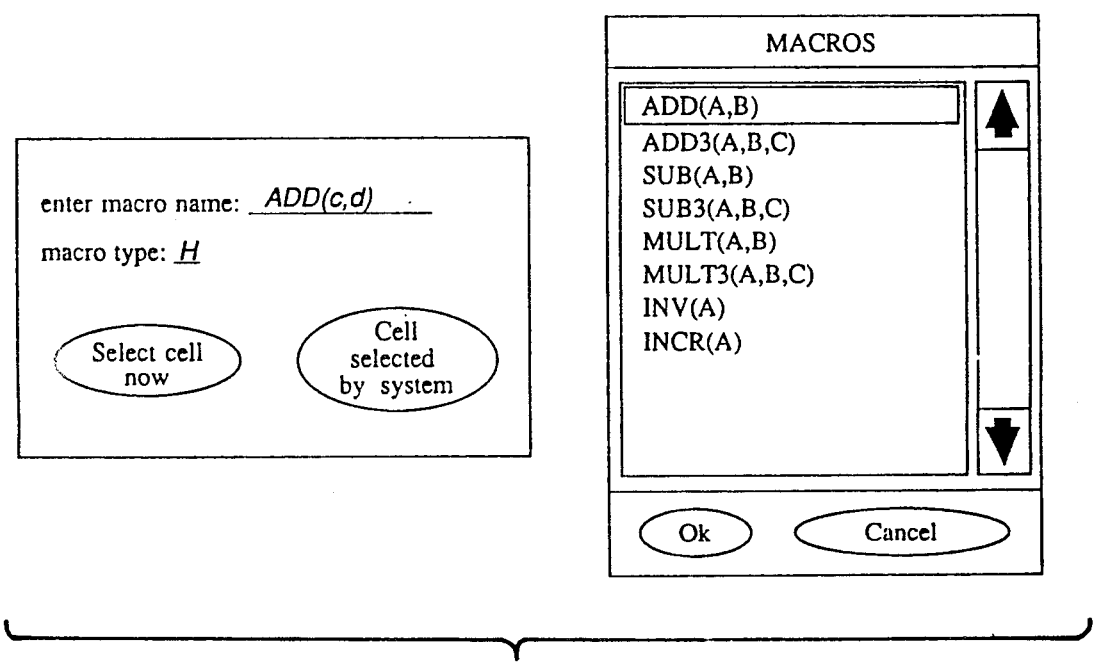
FIG. 4 is an illustration of a computer display screen which the designer uses in defining the functional specifications of the integrated circuit.

Once the states and transitions have been created, the designer assigns operations to each state. These operations are made up of macro functions and arguments. The macro function library 63 in database 60 contains a set of macros defining various operations corresponding to the available actions and conditions which can be specified in a flowchart. During the operation of the EDSIM program 21, the user assigns to each block in the flowchart a macro selected from the macro library and the associated parameters of the macro, if any. FIG. 4 illustrates a screen provided for the designer to specify a macro function in a state in the flowchart. The designer types a macro name along with its parameters in the field associated with the label "enter macro name". In the righthand portion of the screen a macro list is displayed for the designer to select a macro, which can be selected by pointing and clicking a mouse. Once a macro has been selected by this method, the designer would then specify the parameters of the macro. The designer can also select the desired macro type, e.g. hardware (H) or software (S). He then clicks on one of the two circles, "select cell now" or "cell selected by system". If "select cell now" is selected, then EDSIM 21 creates and sends a query to FEXI 40. The expert system FEXI then queries the database and retrieves suitable cells (either hardware or software as desired by the user). If neither is selected by the user, then both types of cells are displayed. FEXI displays this cell list to the designer and waits for him to select a cell. The designer can query about the features of the cells. EDSIM then returns to normal flowchart editing. If the designer had selected "cell selected by system" from the above screen, then FEXI is not invoked and normal flowchart editing continues.

A list of basic macro functions available in the macro function library 63 is shown in Table 1.

TABLE 1

| id | macro name | parameters | description |
|---|---|---|---|
| 1 | ADD | 2 | B = A + B |
| 2 | ADD3 | 3 | C = A + B |
| 3 | SUB | 2 | B = A − B |
| 4 | MULT | 3 | C = A * B |
| 5 | DIV | 3 | C = A/B |
| 6 | DEC | 1 | A = A − 1 |
| 7 | INCR | 1 | A = A + 1 |
| 8 | REG | 2 | B = A |
| 9 | CMP | 2 | compare A and B and set EQ, LT or GT signals |
| 10 | CMP0 | 1 | compare A with 0 and set EQ, LT or GT signals |
| 11 | NEGATE | 1 | A = NOT(A) |
| 12 | MOD | 3 | C = A Modulus B |
| 13 | POW | 3 | C = A B |
| 14 | DC2 | 5 | decode A into B, C, D, and E |
| 15 | EC2 | 5 | encode A, B, C, and D into E |
| 16 | MOVE | 2 | B = A |

FEXI

The front-end expert system interface FEXI 40 is invoked by EDSIM 21 for obtaining user design constraints. FEXI starts an interactive session with the user to determine design constraints for the target ASIC such as the following: speed, die size, number of I/O pins, development time, chip count, desired yield, chip cost, package type, technology, power consumption, production volume, pin count, design style, microprocessor type, etc. Once the user has answered the necessary inquiries regarding the design constraints, FEXI 40 utilizes a knowledge base 41 and an inference engine 42 to determine an optimum design style for the hardware components of the integrated circuit from such choices as PLD (programmable logic device), gate array, standard cell, and macro cell. It then determines the technology to be used, and finally selects a hardware cell library to be used. For the software subsystem, a microprocessor is selected among various established microprocessor designs, such as Intel 8086, Motorola 68000, Intel 80286, etc. The database 60 includes software subroutine libraries for each of the standard microprocessors. Once the microprocessor type has been selected, the appropriate software subroutine library for that microprocessor type is selected. FEXI operates as a separate program which runs in parallel with EDSIM 21. Although illustrated in FIG. 2 separately, FEXI uses the same inference engine used by BLATH 24.

AAF

The AAF file 22 (Antecedent-Action-Form) is the input to BLATH 24. It contains the behavioral description of the system that is to be designed. AAF file 22 contains information about storage elements which compose the data paths, memory elements and external connections to the system. This information is contained in the first section of the file. The rest of the file contains a description of the behavior of the system. The first line of the AAF file 22 contains the name of the system and is described by the following form:
name  <name>
where <name> is the name of the system.

Storage elements are described at the top of the AAF file 22. Storage elements can be data paths, external connections or memory elements. They are defined using the "data path", "data mask", "rom" and "ram" statements. These statements are described by the following forms:
"data path"  <list>
"data mask"  <list>
"rom"  <list>
"ram"  <list>
where <list> is a list of definitions. These lists are further described below.

Data Paths are defined in the "data path" statement. Data paths are described by the following form:
<pathname>'<'<startbit>':'<stopbit>'>'
<Pathname> is the name of the data path. <Startbit> and <stopbit> are the beginning and ending bit positions of the path. Data Paths must be defined before they can be used by the rest of the AAF.

External Connections behave just like data paths except that they define an external connection to the system. An external connection is described just like a data path in the "data path" statement, except that it is preceded by an "⊥" to indicate that it is an external connection.

Data mask provide a means of specifying a partial bitfield that is to be treated as another data path. Data mask are described by the following form:
<maskname>'<'<startbit>':'<stopbit>'>'='
 <pathname>'<'<startbit>':'<stopbit>'>'
<Maskname> is the name of the mask that is to be treated as a data path. <Pathname> is the name of the data path that the partial bitfield comes from. <Startbit> and <stopbit> describe the bitrange of the mask and the bitfield of the data path.

Memory elements define RAMs and ROMs to be used in the system. Memories are defined in the "rom" and "ram" statements. Memory elements are described by the following form:
<memname> '[' <startaddr> ':' <stopaddr> ']' <startbit> ':' <stopbit>
where <memname> is the name of the memory. If the memory is a rom, then this name is also the name of a file containing the contents of the rom. <Startaddr> and <stopaddr> are the beginning and ending addresses of the memory. <Startbit> and <stopbit> are the beginning and ending bit positions of the word contained in the memory.

An example is given to illustrate the top part of an AAF file.

| name | cpuexample; |
|---|---|
| data path | acc<0:15>, ir<0:15>, mar<0:15>, iar<0:15>, mdata<0:15>, sum<0:15>; |
| data mask | adr<0:9> = ir<0:9>; |
| rom | mem[0:65535]<0:7>; |

The behavior of the system is described by state transition information and actions. The state transition information describes the control flow of the system. The actions describe what happens at each state. The representation of the state transition and action information is described in the following sub systems.

State transitions are defined as either being direct or conditional. Direct transitions are described by the following form:
<state1>:<state2>
where <state1> and <state2> are two state names. Direct transitions are an unconditional transition from state1 to state2. This transition will always occur when the system is in state1.

Conditional transitions are described by the following form:
<state1>:.<condition> <state2>
where <state1> and <state2> are the names of two states. <Condition> is the condition that must evaluate to true in order for this transition to be made. The condition is described as an AND function where signals and their compliments are ANDed. Compliments are shown by a "!" and ANDing is described by "*". Some sample conditions are shown below.
a*!b
!GT*!EQ
dog*cat*!bird State actions consist of macros and assertions. Macros are described by the following form:
<macroname>'.'<instance>'(' <paramlist> ')'
<Macroname> is the name of the macro such as ADD or MOVE. <Instance> is a unique number for each instance of a macro. This allows distinctions to be made between the same macro at different states. <Paraml-ist> is a list of zero or more parameter names separated by commas. Macros describe the actions that are to be taken when the system is at a given state. There are four types of parameters that can be used in a macro: Bus, Control, Signal, and Memory.

Bus parameters refer to the data paths or data mask that the macro is applied to. The data path or data mask must be defined in the appropriate statement at the top of the file. Optionally, a bitfield may be specified in the parameter list that will be used instead of the default of using the entire bitrange of the data path.

Control parameters indicate control signals that are necessary for the macro's actions. Controls are defined in the database definition of a macro and used by the rules.

Signal parameters indicate outputs from the macro that go to the controller to indicate the results of the macro. Signals are also defined in the database definition of a macro. Memory parameters refer to a memory that has been previously defined.

An example of the second part of an AAF is given. This example together with the previous example forms a complete AAF.

```
{
start:      ads;
ads    :    ift;
ift    :    dec;
dec    :    excstart;
excend:     end;
end    :    start;
lda    :    excend;
sta    :    excend;
add    :    excend;
bra    :    excend;
brp    :    excend;
excstart .  :.    z2 lda;
excstart    :.    !z2*z3 sta;
excstart    :.    !z2*!z3*z4 add;
excstart    :.    !z2*!z3*!z4*z5*!z0 bra;
excstart    :.    !z2*!z3*!z4*z5*z0 brp;
ads    ::   MOVE.1( iar, mar );
ads    ::   INCR.1( iar );
ift    ::   STORE.1( mem, mar, mdata );
ift    ::   MOVE.2( mdata, ir );
dec    ::   MOVE.3( adr, mar );
dec    ::   DECODE.1( ir<10:15> );
lda    ::   STORE.2( mem, mar, mdata );
lda    ::   MOVE.4( mdata, acc );
sta    ::   LOAD.1( mem, mar, acc );
add    ::   STORE.3( mem, mar, mdata );
add    ::   ADD3.1( mdata, acc, sum );
add    ::   MOVE.5( sum, acc );
bra    ::   MOVE.6( ir<0:9>, iar );
brp    ::   MOVE.7( ir<0:9>, iar );
}
```

BLATH

To design a VLSI system from a flowchart description of a user application, it is necessary to match the functions in a flowchart with hardware cells or software subroutines from the hardware cell library 61 or the software subroutine library 62 (FIG. 2). This mapping preferably utilizes artificial intelligence techniques since the selection process is complicated and is done on the basis of a number of design parameters and constraints. The concept used for selection is analogous to that used in software compilation. In software compilation a number of subroutines are linked from libraries. In the design of VLSI systems, a functional macro can be mapped to members in the hardware cell library or software subroutine library. BLATH uses a rule based expert system to select the appropriate hardware cell or software subroutine to perform each action. If the hardware cell library has a number of cells with different geometries for performing the operation specified by the macro, then an appropriate cell can be selected on the basis of factors such as cell function, process technology used, time delay, power consumption, etc.

The knowledge base of BLATH contains information (rules) for:
1) selection of macros
2) merging of two macros
3) mapping of macros to cells
4) merging two cells
5) error diagnostics The above information is stored in the knowledge base as rules. The first step of cell list generation is the transformation of the flowchart description into a block list. The block list contains a list of the functional blocks to be used in the integrated circuit. The BLATH maps the blocks to cells selected from the cell library, selecting an optimum cell for a block through the use of rules in the knowledge base. The rules which are applied at this point accomplish the following:
Map arguments to data paths
Map actions to macros
Connect these blocks The rules used by BLATH have the following format: rule name

```
        if
                ( condition 1 )
                ( condition 2 )
                ..
                ..
                ( condition n )
        then
                ( action 1 )
                ( action 2 )
                ..
                ..
                ( action m ).
```

Exemplary of the rules used by BLATH are the following:

Rule 1
    IF    no blocks exist
    THEN
        generate a system controller.

Rule 2
    IF    a state exists which has a macro AND
        this macro has not been mapped to a block
    THEN
        find a corresponding macro in the library
        and generate a block for this macro.

Rule 3
    IF    there is a transition between two states AND
        there are macros in these states using the same argument
    THEN
        make a connection from a register corresponding to the first macro to another register corresponding to the second macro.

Rule 4
    IF    a register has only a single connection from another register
    THEN
        combine these registers into a single register.

Rule 5
    IF    there are two comparators AND
        input data widths are of the same size AND
        one input of these is same AND
        the outputs of the comparators are used to -continued

|  |  | perform the same operation. |
|---|---|---|
|  | THEN |  |
|  |  | combine these comparators into a single comparator. |
| Rule 6 |  |  |
|  | IF | there is a data without a register |
|  | THEN |  |
|  |  | allocate a register for this data. |
| Rule 7 |  |  |
|  | IF | all the blocks have been interconnected AND a block has a few terminals not connected |
|  | THEN |  |
|  |  | remove the block and its terminals, or issue an error message. |
| Rule 8 |  |  |
|  | IF | memory is to be used, but a block has not been created for it |
|  | THEN |  |
|  |  | create a memory block with data, address, read and write data and control terminals. |
| Rule 9 |  |  |
|  | IF | a register has a single connection to a counter |
|  | THEN |  |
|  |  | combine the register and the counter; remove the register and its terminals. |
| Rule 10 |  |  |
|  | IF | there are connections to a terminal of a block from many different blocks |
|  | THEN |  |
|  |  | insert a multiplexor; remove the connections to the terminals and connect them to the input of the multiplexor; connect the output of the multiplexor to the input of the block. |

Additional rules address the following points:
remove cell(s) that can be replaced by using the outputs of other cell(s)
reduce multiplexor trees
use fan-out from the cells, etc.

Database

The database 60 stores information relating to hardware cells, software subroutines, macro functions, user information, and the like. A database interface 65 is provided to allow the system manager to make additions, deletions and modifications to the database. A user table 66 maintains information for every valid user of the ISSC system, including the user identification name, number and password. In the hardware cell library 61 various types of data are stored for each cell, including:

1) functional level information: description of the cell at the register transfer level
2) logic level information: description and terms of flip flops and gates
3) circuit level information: description at the transistor level
4) layout level information: geometrical mask level specifications A cell table within the hardware cell library 61 contains a record for each cell in the cell library. Every cell in the cell table can be used as instance cell of a larger cell. Once a cell becomes an instance of a larger cell, a data dependency is created. Once this occurs, the contents in the cell can not be altered until the data dependency is eliminated. This information is kept in the attribute "times_used". The attributes of a cell as kept in the cell table are summarized in Table 2:

TABLE 2

| Key | Name | Type | Integrity | Description |
|---|---|---|---|---|
| 1 | cell_id | i4 | >=0 | cell identification number |
|  | cell_name | c12 | alpha-numeric | cell name assigned by designer |
|  | user_id | i4 | >=0 | user id of the owner of cell |
|  | width | i4 | >0 | width of cell in centi-microns |
|  | height | i4 | >0 | height of cell in centi-microns |
|  | cif_name | c20 | unix file name | name of the cif file |
|  | technology_id | i4 | >=0 | id of associated technology |
|  | test_id | i4 | >=0 | id of the test tool(s) used |
|  | macro_id | i4 | >=0 | id of macro function for cell |
|  | delay | f4 | >0 | max. prop. delay in nano second |
|  | power | i4 | >0 | power consumption in micro watt |
|  | net_name | c20 | unix file name | name of the netlist file |
|  | protection | i4 | >=0 | flags for user, group, world prot. |
|  | times-used | i4 | >=0 | counts cell reference quantity |
|  | date | date |  | date created |

An example of a cell is shown below:

| | |
|---|---|
| cell_id | 23 |
| cell_name | XIN02 |
| user_id | 8946 |
| width | 68 |
| height | 2.2 |
| cif_name | xin02.cif |
| technology_id | 1 |
| test_id | 1 |
| macro_id | 4 |
| delay | 0.3 |
| power | 25 |
| net_name | xin02.mdl |
| protection | 555 |
| date | 88-11-10 |

Each terminal for a cell is kept in a terminal table. Terminals can be signal, power or ground. The cell_id determines which cell the terminal belongs to. In order to uniquely identify the terminal, both cell_id and terminal_id are required. More than one terminal per cell can have the same terminal name but they are distinguished by the conjunction of cell_id and terminal_id.

The attributes of the terminal table are set forth in Table 3.

TABLE 3

| Key | Name | Type | Integrity | Description |
|---|---|---|---|---|
| 1 | cell_id | i4 | >=0 | cell identification number |
| 2 | terminal_id | i4 | >=0 | terminal identification number |
|  | name | c20 | alpha-numeric | terminal name |
|  | type | c5 | alpha-numeric | terminal type (vdd, gnd, signal) |
|  | layer | c5 | alpha-numeric | terminal layer (m1, poly, diff) |
|  | direction | c1 | l,r,t,b | terminal exit side |
|  | x | i4 |  | x coordinate of the terminal |
|  | y | i4 |  | y coordinate of the terminal |
|  | width | i4 |  | terminal width |

The cellref table contains the hierarchical cell structure. Using this table, it is possible to learn if a cell has any parent, and therefore a data dependency. The attributes of the cellref table are set forth in Table 4:

TABLE 4

| Key | Name | Type | Integrity | Description |
|---|---|---|---|---|
| 1 | parent_id | i4 | >=0 | cell id of the parent |
| 2 | child_id | i4 | >=0 | cell id of the child |
| 3 | instance_id | i4 | >=0 | instance id to distinguish cells |
|   | x | i4 |   | x coordinate of the instance |
|   | y | i4 |   | y coordinate of the instance |
|   | MX | i2 | Boolean | True if inst. is mirrored in X |
|   | MY | i2 | Boolean | True if inst. is mirrored in Y |
|   | RO | i2 | Boolean | Rotation variable in X |
|   | R1 | i2 | Boolean | Rotation variable in Y |

Technology refers to a particular process run of a IC foundry. For each entry in the technology table, there is a set of cells that uses the technology (called cell library). Each record in this table is a unique process run to not only within the foundry, but also within the corporation. The attributes of the technology table are set forth in Table 5 below:

TABLE 5

| Key | Name | Type | Integrity | Description |
|---|---|---|---|---|
| 1 | technology_id | i4 | >=0 | id that identifies technology |
|   | facility | c20 | alpha-numeric | name and location of fab house |
|   | device | c10 | alpha-numeric | CMOS, bipolar, HCMOS, GaAs, etc. |
|   | feature_size | i4 | >0 | channel width of a transistor |
|   | no_metal | i2 | >=0 | number of metals used |
|   | no_poly | i2 | >=0 | number of polysilicons used |
|   | well_type | c10 | alpha-numeric | N-Well, P-Well, etc. |

Every standard frame used for a specific technology is described in the frame table. Frame table is related to the technology table by the key technology_id. Each frame must belong to one and only one technology, while each technology can have many frames. Each record in the frame table represents a frame. The attributes of the frame table are set forth in Table 6 below:

TABLE 6

| Key | Name | Type | Integrity | Description |
|---|---|---|---|---|
| 1 | frame_id | i4 | >=0 | id that identifies each frame |
| 2 | technology_id | i4 | >=0 | id of corresponding technology |
|   | no_pads | i2 | >0 | number of pads in the frame |
|   | in_width | i4 | >=0 | width of usable space in frame |
|   | in_height | i4 | >=0 | height of usable space in frame |
|   | out_width | i4 | >0 | total frame width with pads |
|   | out_height | i4 | >0 | total frame height with pads |

The software subroutine library 62 includes for each microprocessor type, predefined software subroutines which correspond to the macro functions which can be implemented in software. Typical subroutines used in ISSC are standard I/O macros, data conversion macros, character conversion macros, and string manipulation macros.

Every macro function used in categorizing a cell in terms of its function is stored as a single record entry in a macro table contained within the macro function library 63. Many cells within the cell library can be capable of performing the function of a macro. Each macro in the table is uniquely identified by the key macro_id. The attributes of the macro table are set forth in Table 7:

TABLE 7

| Key | Name | Type | Integrity | Description |
|---|---|---|---|---|
| 1 | macro_id | i4 | >=0 | id that identifies each macro |
|   | macro_name | c20 | alpha-numeric | macro name describing function |
|   | no_inputs | i2 | >=0 | number of inputs in function |
|   | no_outputs | i2 | >=0 | number of outputs in function |
|   | description | c80 | sdl | description |

CONGEN

CONGEN 27 used the STF file from BLATH 24 to design a PLA based system controller for the chip which generates control signals to enable the respective hardware cells or the microprocessor. The STF file is translated to Boolean equations for PLA logic that implements next state codes and output functions. A unique code is assigned for each state by applying heuristic rules for state assignment. The output of CONGEN is an input parameter file for automatic PLA layout generation.

SOFTCOM

SOFTCOM 70 takes as input the STF file 26 created by BLATH 24 and generates an assembly program which is the monitor program for the microprocessor. Some of the variables of this program are:
NUM_SHARED is the number of shared variables between software and hardware
REG_ARRAY[0.. NUM_SHARED] is a external register array.
NUM_SUB is the number of software routines in the system.
SHARED_VARS is an array of memory locations at which the shared variables are stored.
change_flag: associated with each shared variable is a flag which is set if that variable's value is changed.
The program format is as follows:

```
1)  set change_flag for shared variables to false.
2)  get subroutine code from REG_ARRAY[0]
3)  if code = = 1 then call subroutine 1
    if code = = 2 then call subroutine 2
    ...
    ...
    if code = = NUM_SUB then call subroutine_num_sub
4)  for i = 1 to NUM_SHARED do
    {
        if change_flag set then
            move SHARED_VARS[i] TO REG_ARRAY[i]
    }
5)  transfer control to the system controller
```

Design Example

Figure 5:
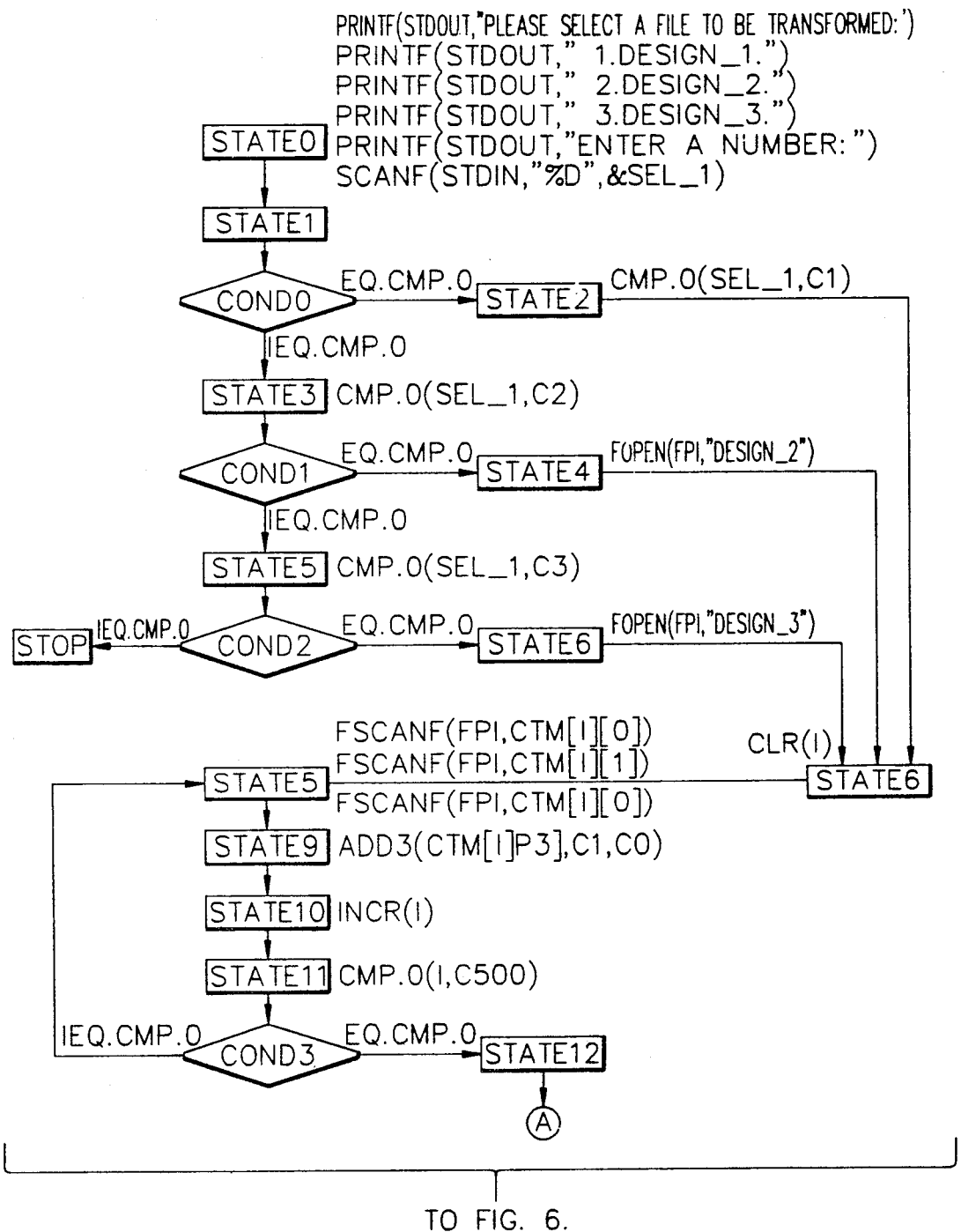
FIGS. 5 and 6 are flowcharts illustrating the functions to be performed by an ASIC in an illustrative design example of the system and method of the invention.
Figure 6:
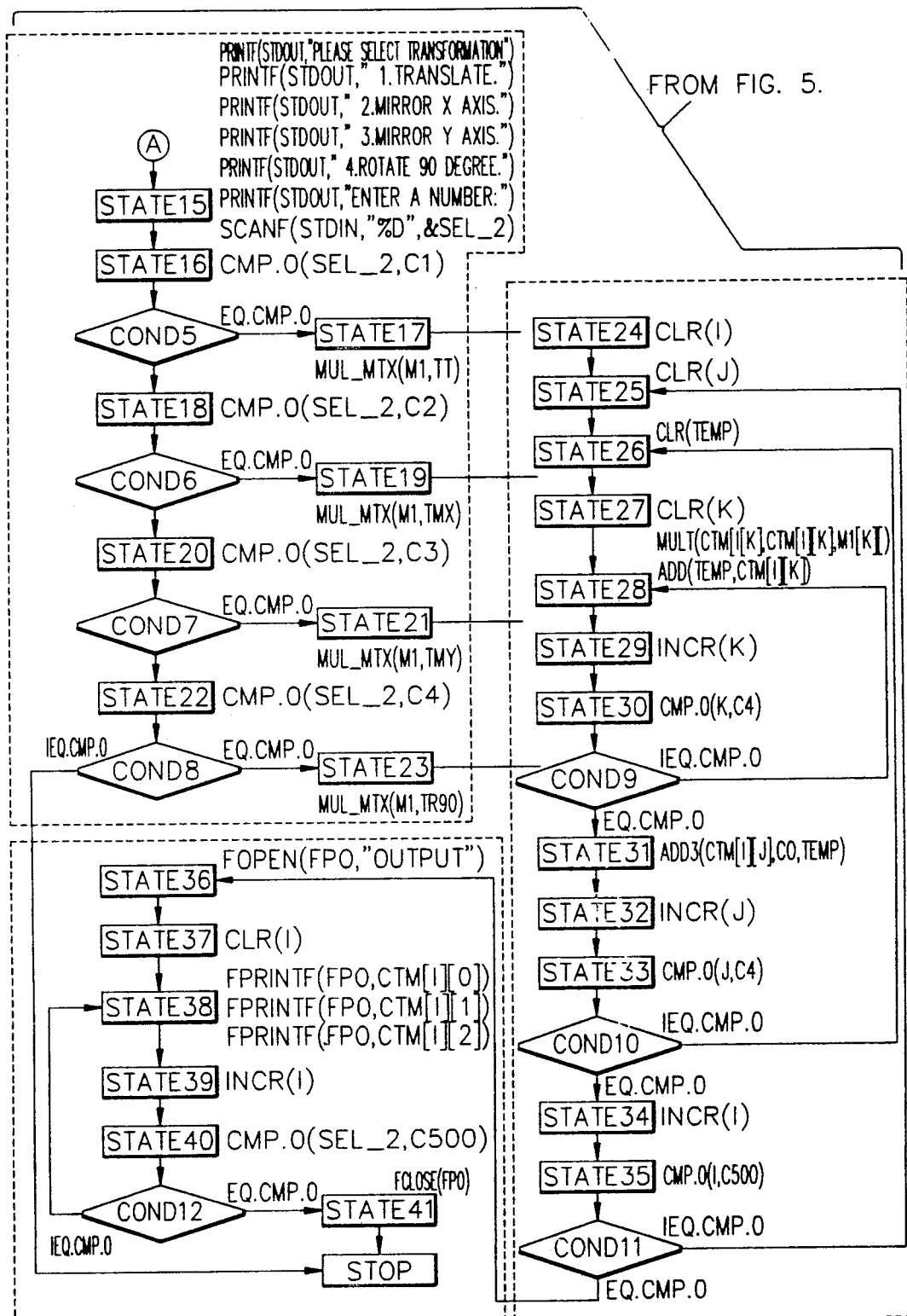

This example illustrates the design approach employed in designing an application specific integrated circuit which does simple computer graphics operations such as translation, mirror image of X axis or Y axis, and rotation. All of those operations are involved in matrix multiplication with the transformation axis. The matrix multiplication will be implemented in hardware to speed up the process. FIG. 5 is a flowchart illustrating a first software portion (software portion #1) of the foregoing program which is to be processed by the microprocessor subsystem within the target ASIC. FIG. 6 is a continuation of the flowchart of FIG. 5 and illustrates the remaining portion of software portion #1 as well as software portion #2 to be processed by the microprocessor subsystem within the target ASIC, and additionally shows the non-microprocessor hardware subsystem within the target ASIC.

Figure 7:
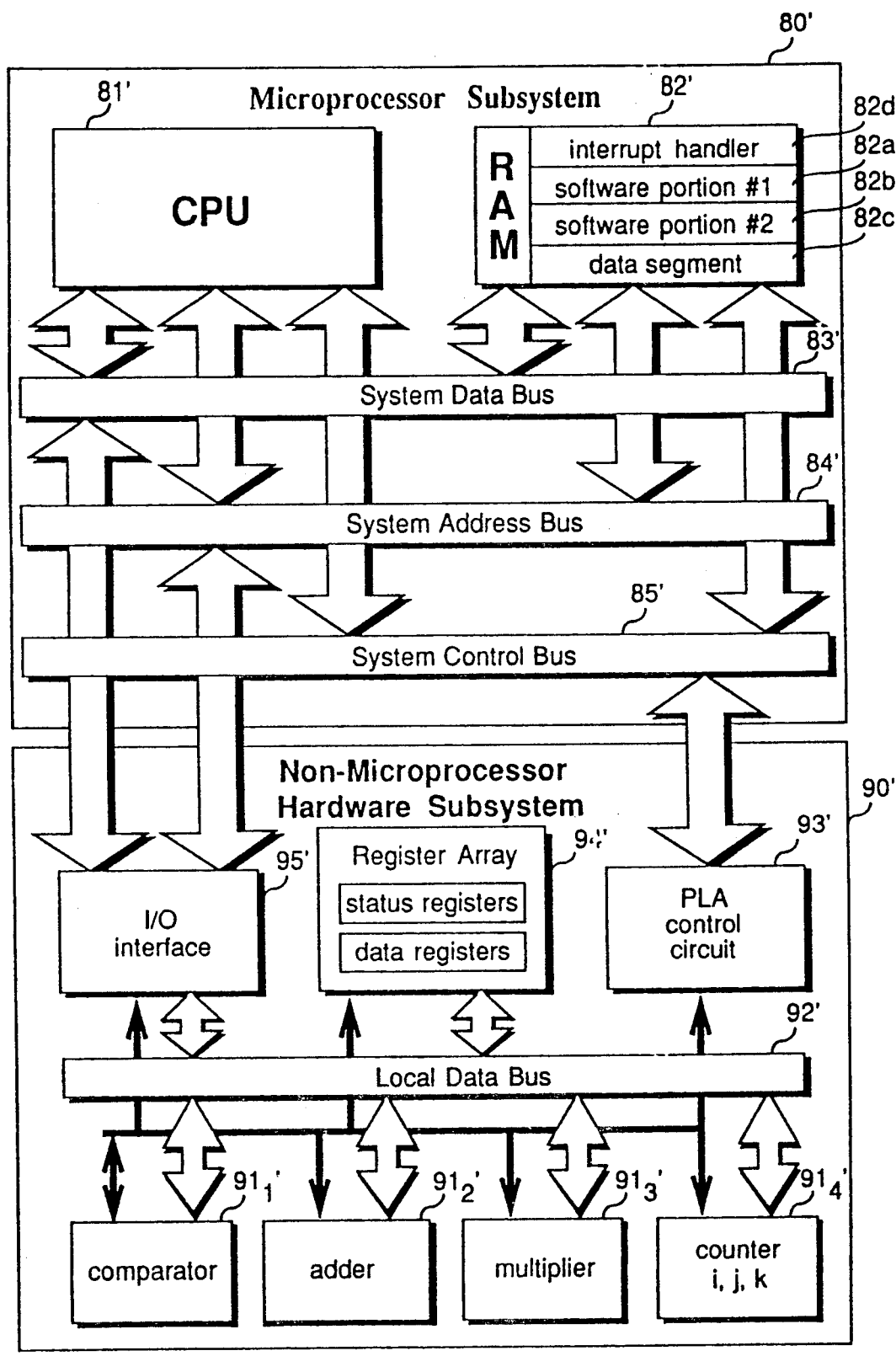
FIG. 7 is a schematic illustration similar to FIG. 3, but showing the particular ASIC of the design example.

FIG. 7 is a block schematic diagram similar to the general diagram of FIG. 3 but showing the components which would be utilized in the above-noted specific example. To avoid repetitive description, elements in FIG. 7 which correspond to elements previously described in connection with FIG. 3 will be identified by the same reference characters with prime notation (') added. The microprocessor subsystem 80' contains CPU 81' and RAM 82' (main memory). The execution code of software portions #1 and #2 (82a, 82b) are stored in the main memory of microprocessor subsystem. The data segment 82c contains the data to be processed by both CPU and non-microprocessor hardware subsystem. The data in data segment 82c are sent to data registers via the system data bus 83'. The communication between microprocessor subsystem 80' and hardware subsystem 90' is coordinated by using interrupts. After software portion #1 (82a) is executed, microprocessor subsystem 80' reads the status registers to see if hardware subsystem 90' is busy. If hardware subsystem 90' is idle, its status registers are set, and the hardware subsystem 90' is activated.

When hardware subsystem 90' finishes the task, it generates an interrupt signal to microprocessor subsystem 80'. The interrupt is serviced by interrupt handler 82d. The main tasks of the interrupt handler include:
push contents of microprocessor subsystem 80' registers into stack.
transfer data from hardware subsystem 90' to microprocessor subsystem 80'.
reset the status register of hardware subsystem 90'.
restore the contents of microprocessor subsystem 80' registers from stack.
continue the execution of software portion #2 (82b).

The execution flow of the entire flowchart (including software and hardware portions) is as follows:
1. Microprocessor subsystem 80' executes the codes in software portion #(82a).
2. Microprocessor subsystem 80' activates hardware subsystem 80' by overwriting the status registers, then sends the data to data registers.
3. Hardware subsystem 90' processes the data in data registers
4. After hardware subsystem 90' processed the data, it sends interrupt signal to microprocessor subsystem 80'.
5. The interrupt handler 82d of microprocessor subsystem 80' handles the interrupt, transfers the data from data registers back to microprocessor subsystem, and resets the status registers. After the interrupt is processed, the execution flow is returned to software portion #2.
6. Microprocessor subsystem 80' executes the codes in software portion #2.
7. Done.

As shown in FIG. 6, states 24-35 and conditions 9-11 are implemented in hardware subsystem to perform multiply/accumulate operation. A multiplier and an adder are used in state 28 to implement the multiply/accumulate operations. The blocks indicated as state 24, state 25, state 27, state 29, state 32, and state 34 use counters i, j, k, which have increment and clear capabilities. In state 26 and state 31, temp is used as a temporary register to store the intermediate result. State 30, state 33, and state 35 use a comparator. The result of the comparison will affect the control flow which specified in cond9, cond10, and cond11.

The execution flow of hardware subsystem is as follows:
1. Microprocessor subsystem sends a start signal to hardware subsystem via system control bus.
2. All the data are loaded to data registers via system data bus.
3. Loop counters i, j, and k are reset to zero initially. Register temp is also reset to zero.
4. Multiply/Accumulate operation.
5. Increment the loop counters and check if the end of the loops. If it is not end of the loops, go to step 3; else exits the loops.
6. The result of multiply/accumulate operation is stored in the output register that is connected to system data bus.
7. An interrupt signal is sent to the microprocessor subsystem via system control bus.

While the invention has been described herein with reference to a specific embodiment, the description is illustrative of the invention and is not to be construed as limiting the invention. Various modifications and applications may occur to those skilled in the art without departing from the true spirt and scope of the invention as defined by the appended claims.

That which is claimed is:

1. A computer-aided design system for designing an application specific integrated circuit from architecture independent functional specifications for the integrated circuit, whose intended function is implemented by both a hardware subsystem including hardware elments on the integrated circuit and by a software subsystem including software instructions executed by a microprocessor on the integrated circuit, comprising
input means operable by a user for defining architecture independent functional specifications for the application specific integrated circuit wherein at least one of said architecture independent functional specifications is free of indication that an intended function of said integrated circuit is implanted on said hardware subsystem or said software subsystem, and
computer operated means for translating the architecture independent functional specifications into an architecture specific structural level definition of the integrated circuit, said computer operated translating means comprising
means defining software instructions of the software subsystem from the architecture independent functional specifications, at least one of which is free of indication that an intended function of said integrated circuit is implemented on said hardware subsystem or said software subsystem, means defining a microprocessor for executing the software instructions of the software subsystem from the architecture independent functional specifications, at least one of which is free of indication that an intended function of said integrated circuit is implemented on said hardware subsystem or said software subsystem, means defining hardware elements for executing the hardware functions of the hardware subsystem from the architecture independent functional specifications, at least one of which is free of indication that an intended function of said integrated circuit is implemented on said hardware subsystem or said software subsystem, and means defining interconnections between the microprocessor for executing the software instructions of the software subsystem and the hardware elements of the hardware subsystem.

2. The system as defined in claim 1 wherein said architecture independent functional specifications are comprised of a series of operations, and wherein said computer operated means comprises a cell library defining a set of available integrated circuit hardware cells for performing said operations;

a software subroutine library defining a set of available software subroutines for performing said operations; and selection means for selecting from said cell library or from said software subroutine library for each operation specified by said specification input means, appropriate hardware cells or software subroutines for performing the operations specified by the functional specifications.

3. The system as defined in claim 2 wherein said selection means comprises an expert system including a knowledge base containing rules for selecting hardware cells from said cell library and software subroutines from said software subroutine library, and inference engine means for selecting appropriate hardware cells or software subroutines from said libraries in accordance with the rules of said knowledge base.

4. A computer-aided design system for designing an application specific integrated circuit from architecture independent functional specifications for the integrated circuit whose intended function is implemented by both a hardware subsystem including hardware elements on the integrated circuit and by a software subsystem including software instructions executed by a microprocessor on the integrated circuit, comprising a macro library defining a set of architecture independent operations comprised of actions and conditions wherein at least one of said architecture independent operations is free of indication that the operation is implemented on said hardware subsystem or said software subsystem;

specification input means operable by a user for defining architecture independent functional specifications for the integrated circuit wherein at least one of said architecture independent functional specifications is free of indication that an intended function of said integrated circuit is implemented on said hardware subsystem or said software subsystem, said architecture independent functional specifications being comprised of a series of architecture independent operations which implement the intended function of the application specific integrated circuit wherein at least one of said operations is free of indication that an intended function of the integrated circuit is implemented or said hardware subsystem or said software subsystem, said specification input means including means to permit the user to specify for each operation in the defined series of operations a macro selected from said macro library;

a hardware cell library defining a set of available integrated circuit hardware cells for performing operations defined in said macro library wherein at least one of said operations is free of indication that an intended function of the integrated circuit is implemented on said hardware subsystem or said software subsystem;

a software subroutine library defining a set of available software subroutines for performing operations defined in said macro library wherein at least one of said operations is free of indication that an intended function of the integrated circuit is implemented on said hardware subsystem or said software subsystem;

selection means for selecting from said hardware cell library or from said software subroutine library for each macro specified by said specification input means, appropriate hardware cells or software subroutines for performing the operation defined by the specified macro wherein at least one of said operations is free of indication that an intended function of the integrated circuit is implemented on said hardware subsystem or said software subsystem, said selection means comprising an expert system including a knowledge base containing rules for selecting hardware cells from said hardware cell library and software subroutines fiom said software subroutine library, and inference engine means for selecting appropriate hardware cells or software subroutines from said libraries in accordance with the rules of said knowledge base.

5. The system as defined in claim 4 wherein said specification input means includes means to enable the user, when specifying a macro selected from said macro library, to define whether the macro function is to be implemented in hardware or in software.

6. The system as defined in claim 4 additionally including design constraint input means operable by a user for defining design constraints for the application specific integrated circuit.

7. The system as defined in claim 6 wherein said design constraint input means includes means to enable the user to define one or more design constraints for the application specific integrated circuit selected from the group consisting of annual volume, speed, size, pin count, packaging type, power consumption, and thermal stability.

8. The system as defined in claim 7 wherein said knowledge base additionally contains design style rules for selecting, based upon the design constraints, an optimum design style for implementation of the hardware subsystem.

9. The system as defined in claim 8 wherein said design style is selected from the group consisting of programmable logic device (PLD), gate array, standard cell, and macro cell.

10. The system as defined in claim 6 wherein said design constraint input means includes means to enable the user to select, from a set of predefined available standard microprocessors, the particular microprocessor type to be utilized by the software subsystem.

11. The system as defined in claim 10 wherein said software subroutine library includes sets of software subroutines corresponding to each available standard microprocessor type.

12. The system as defined in claim 6 wherein said knowledge base additionally contains design constraint rules for selecting appropriate hardware cells or software subroutines based upon the design constraints defined by said design constraint input means.

13. The system as defined in claim 4 wherein said specification input means comprises flowchart editor means for creating a flowchart having elements representing said series of actions and conditions.

14. The system as defined in claim 4 wherein said specification input means comprises means for receiving user input of a list defining the series of actions and conditions which implement the function of the application specific integrated circuit.

15. The system as defined in claim 4 wherein said selection means comprises means for generating a netlist defining the microprocessor to be utilized by the software subsystem and the hardware cells to be utilized by the hardware subsystem, and interconnection information for interconnecting the microprocessor and the hardware cells to perform the intended function of the application specific integrated circuit.

16. The system as defined in claim 15 wherein said selection means additionally includes control generator means for generating a controller and control paths for controlling operation of the microprocessor and the hardware cells selected by said cell selection means.

17. The system as defined in claim 15 additionally including mask data generator means for generating from said netlist the mask data required to produce an integrated circuit having the specified functional requirements.

18. The system as defined in claim 4 additionally including software compiler means for generating software operable by the microprocessor for performing functions of the software subsystem.

19. A computer-aided design system for designing an application specific integrated circuit from a flowchart defining architecture independent functional requirements of the integrated circuit, whose intended function is implemented by both a hardware subsystem including hardware elements on the integrated circuit and by a software subsystem including software instructions executed by a microprocessor on the integrated circuit, comprising
 a computer system;
 a macro library, stored in said computer system, defining a set of possible architecture independent actions and conditions wherein at least one of said architecture independent actions and conditions is free of indication that the action or condition is implemented on said hardware subsystem or said software subsystem;
 flowchart editor means, executing on said computer system, operable by a user for creating a flowchart having elements representing said architecture independent actions and conditions wherein at least one of said architecture independent actions and conditions is free of indication that the action or condition is implemented on said hardware subsystem or said software subsystem, said flowchart editor means, executing on said computer system, including macro specification means, executing on said computer system, for permitting the user to specify for each architecture independent action or condition represented in the flowchart a macro selected from said macro library;
 a hardware cell library, stored in said computer system, defining a set of available integrated circuit hardware cells for performing the architecture independent actions and conditions defined in the macro library wherein at least one of said architecture independent actions and conditions is free of indication that the action or condition is implemented on said hardware subsystem or said software subsystem;
 a software subroutine library, stored in said computer system, defining a set of available software subroutines for performing the architecture independent actions and conditions defined in the macro library wherein at least one of said architecture independent actions and conditions is free of indication that the action or condition is implemented on said hardware subsystem or said software subsystem; and
 selection means, executing on said computer system, for selecting from said hardware cell library or from said software subroutine library for each macro specified by said flowchart editor means, executing on said computer system, appropriate hardware cells or software subroutines for performing the architecture independent action or condition defined by the specified macro, and for generating a netlist defining the microprocessor to be utilized by the software subsystem and the hardware cells to be utilized by the hardware subsystem, and interconnection information for interconnecting the microprocessor for executing the software subroutines and the hardware cells to perform the intended function of the application specific integrated circuit.

20. The system as defined in claim 19 wherein said selection means comprises a knowledge base containing rules for selecting hardware cells from said cell library and software subroutines from said software subroutine library, and inference engine means for selecting appropriate hardware cells or software subroutines from said libraries in accordance with the rules of said knowledge base.

21. A computer-aided design process for designing, in a computer system, an application specific integrated circuit from architecture independent functional specifications for the integrated circuit, whose intended function is implemented by both a hardware subsystem including hardware elements on the integrated circuit and by a software subsystem including software instructions executed by a microprocessor on the integrated circuit, comprising the following steps performed by said computer system:
 storing in a macro library in said computer system, a set of definitions of possible architecture independent actions and conditions wherein at least one of said architecture independent actions and conditions is free of indication that the action or condition is implemented on said hardware subsystem or said software subsystem;
 storing in a hardware cell library in said computer system, data describing a set of available integrated circuit hardware cells for performing the architecture independent actions and conditions wherein at least one of said architecture independent actions and conditions is free of indication that the action or condition is implemented on said hardware subsystem or said software subsystem;

storing in a software subroutine library in said computer system, data describing a set of software subroutines for performing the architecture independent actions and conditions wherein at least one of said architecture independent actions and conditions is free of indication that the action or condition is implemented on said hardware subsystem or said software subsystem;

storing in an expert system knowledge base in said computer system, a set of rules for selecting hardware cells or software subroutines to perform the architecture independent actions and conditions wherein at least one of said architecture independent actions and conditions is free of indication that the action or condition is implemented on said hardware subsystem or said software subsystem;

describing for a proposed application specific integrated circuit a series of architecture independent actions and conditions which will implement the intended function of the application specific integrated circuit wherein at least one of said architecture independent actions and conditions is free of indication that the action or condition is implemented on said hardware subsystem or said software subsystem;

specifying for each described architecture independent action and condition of the series one of said stored definitions from the macro library stored in said computer system which corresponds to the desired architecture independent action or condition to be performed; and selecting from said hardware cell library stored in said computer system or from said software subroutine library stored in said computer system for each of the specified definitions, appropriate integrated circuit hardware cells of software subroutines for performing the desired function of the application specific integrated circuit.

22. A process as defined in claim 21 wherein said step of selecting a hardware cell or a software subroutine comprises applying to the specified definition of the action or condition to be performed, a set of cell selection rules and software subroutine selection rules stored in the knowledge base in said computer system.

23. A process as defined in claim 21 including the further step performed by said computer system of generating a netlist defining the microprocessor and the hardware cells which are needed to perform the desired function of the integrated circuit and the connections therebetween.

24. A process as defined in claim 23 including the further step of generating from said netlist the mask data required to produce an integrated circuit having the specified functional requirements.

25. A computer-aided knowledge based design process for designing in a computer system an application specific integrated circuit from architecture independent functional specifications for the integrated circuit, whose intended function is implemented by both a hardware subsystem including hardware elements on the integrated circuit and by a software subsystem including software instructions executed by a microprocessor on the integrated circuit, comprising the following steps performed by said computer system:

storing in a macro library in said computer system, a set of macros defining possible architecture independent actions and conditions wherein at least one of said architecture independent actions and conditions is free of indication that the action or condition is implemented on said hardware subsystem or said software subsystem;

storing in a hardware cell library in said computer system, data describing a set of available integrated circuit hardware cells for performing the architecture independent actions and conditions wherein at least one of said architecture independent actions and conditions is free of indication that the action or condition is implemented on said hardware subsystem or said software subsystem;

storing in a software subroutine library in said computer system, data describing a set of available software subroutines for performing the architecture independent actions and conditions wherein at least one of said architecture independent actions and conditions is free of indication that the action or condition is implemented on said hardware subsystem or said software subsystem;

storing in a knowledge base in said computer system, a set of rules for selecting hardware cells from said hardware cell library and software subroutines from said software subroutine library to perform the architecture independent actions and conditions defined by the stored macros wherein at least one of said architecture independent actions and conditions is free of indication that the action or condition is implemented on said hardware subsystem or said software subsystem;

describing for a proposed application specific integrated circuit a series of architecture independent actions and conditions which carry out the function to be performed by the hardware cells and software subroutines of the integrated circuit wherein at least one of said architecture independent actions and conditions is free of indication that the action or condition is implemented on said hardware subsystem or said software subsystem;

specifying for each described action and condition of said series a macro selected from the macro library stored in said computer system which corresponds to the action or condition; and applying rules of said knowledge base stored in said computer system to the specified macros to select from said hardware cell library stored in said computer system and from said software subroutine library stored in said computer system, the hardware cells and software subroutines required for performing the desired function of the application specific integrated circuit.

26. A process as defined in claim 25 wherein said step of describing a series of actions and conditions comprises creating a flowchart comprised of elements representing actions and conditions.

27. A process as defined in claim 25 wherein said step of specifying a macro selected from the macro library further includes defining whether the macro function is to be implemented in hardware or in software.

28. A process as defined in claim 27 including the step of generating software code for use by the microprocessor in performing the macro functions which are specified to be implemented in software.

29. A process as defined in claim 25 including defining one or more design constraints for the application specific integrated circuit selected from the group consisting of annual volume, speed, size, pin count, packaging type, power consumption, and thermal stability.

30. A process as defined in claim 29 wherein said knowledge base additionally contains design style rules for selecting, based upon the design constraints, an optimum design style for implementation of the hardware subsystem, and wherein said step of applying the rules of the knowledge base includes selecting, based upon the design constraints, an optimum design style for implementation of the hardware subsystem.

31. A process as defined in claim 30 wherein said design style is selected from the group consisting of programmable logic device (PLD), gate array, standard cell, and macro cell.

32. A process as defined in claim 25 wherein said step of specifying a macro selected from the macro library further includes indicating, for at least certain ones of the specified macros, that the selection of whether the macro function is to be implemented in hardware or in software is to be made by the computer system, and wherein said knowledge base additionally contains implementation rules for determining the optimum implementation of macro functions either in the hardware subsystem or in the software subsystem, and wherein said step of applying the rules of the knowledge base includes determining, based upon the implementation rules in said knowledge base, the optimum implementation of the macro function either in the hardware subsystem or the software subsystem.

* * * * *

UNITED STATES PATENT AND TRADEMARK OFFICE
CERTIFICATE OF CORRECTION

PATENT NO. : 5,197,016

DATED : March 23, 1993

INVENTOR(S) : Tai Sugimoto et al.

It is certified that error appears in the above-identified patent and that said Letters Patent is hereby corrected as shown below:

Column 6, line 64, "C = A  B" should be -- $C = A \oplus B$ --.

Column 8, line 1, " "$\perp$"" should be -- "$\theta$" --.

Column 16, line 48, "elments" should be -- elements --.

Signed and Sealed this

Fifteenth Day of March, 1994

Attest:

BRUCE LEHMAN

Attesting Officer       Commissioner of Patents and Trademarks